United States Patent
Ellis et al.

(10) Patent No.: US 9,645,744 B2
(45) Date of Patent: May 9, 2017

(54) SUSPENDING AND RESUMING NON-VOLATILE MEMORY OPERATIONS

(71) Applicant: SanDisk Enterprise IP LLC, Milpitas, CA (US)

(72) Inventors: Robert W. Ellis, Phoenix, AZ (US); James M. Higgins, Chandler, AZ (US); Ryan R. Jones, Mesa, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 73 days.

(21) Appl. No.: 14/599,183

(22) Filed: Jan. 16, 2015

(65) Prior Publication Data

US 2016/0026386 A1    Jan. 28, 2016

Related U.S. Application Data

(60) Provisional application No. 62/027,712, filed on Jul. 22, 2014.

(51) Int. Cl.
*G06F 3/06* (2006.01)
*G06F 13/16* (2006.01)
*G11C 16/32* (2006.01)

(52) U.S. Cl.
CPC .......... *G06F 3/061* (2013.01); *G06F 3/0659* (2013.01); *G06F 3/0679* (2013.01); *G06F 13/1642* (2013.01); *G11C 16/32* (2013.01)

(58) Field of Classification Search
CPC .......... G06F 2212/7209; G06F 3/0608; G06F 3/0679; G06F 13/18; G06F 3/0601;
(Continued)

(56) References Cited

U.S. PATENT DOCUMENTS 4,586,167 A    4/1986 Fujishima et al.
5,559,988 A    9/1996 Durante et al.
(Continued)

FOREIGN PATENT DOCUMENTS

EP    0 376 285 A2    7/1990
WO    WO 2012/083308    6/2012

OTHER PUBLICATIONS

International Search Report and Written Opinion dated Nov. 18, 2015, received in International Patent Application No. PCT/US2015/039552 which corresponds to U.S. Appl. No. 14/559,183, 11 pages (Ellis).

(Continued)

*Primary Examiner* — Zhuo Li
(74) *Attorney, Agent, or Firm* — Morgan, Lewis & Bockius LLP

(57) ABSTRACT

A method of operation in a non-volatile memory system includes starting execution of a first memory operation from a first queue and in conjunction with starting a first timer, set to expire after a first predetermined time interval. The method further includes, in accordance with a determination that the first timer has expired, determining whether a second queue contains at least one memory operation for execution, and if so, suspending the first memory operation, executing a second memory operation from the second queue, and after completing execution of the second memory operation from the second queue, performing one or more subsequent operations (e.g., resuming execution of the first memory operation and restarting the first timer). In addition, the method includes, when the second queue does not contain at least one memory operation for execution, restarting the first timer, and continuing execution of the first memory operation from the first queue.

25 Claims, 11 Drawing Sheets

(58) Field of Classification Search
CPC ............... G06F 3/0659; G06F 13/1642; G11C 13/0069; G11C 2013/0076; G11C 16/102; G11C 7/22; G11C 16/32
See application file for complete search history.

(56) References Cited

U.S. PATENT DOCUMENTS

| | | |
|---|---|---|
| 5,909,559 A | 6/1999 | So |
| 6,247,136 B1 | 6/2001 | MacWilliams et al. |
| 6,292,410 B1 | 9/2001 | Yi et al. |
| 6,401,213 B1 | 6/2002 | Jeddeloh |
| 6,449,709 B1 | 9/2002 | Gates |
| 8,010,738 B1 | 8/2011 | Chilton et al. |
| 8,122,202 B2 | 2/2012 | Gillingham |
| 8,213,255 B2 | 7/2012 | Hemink et al. |
| 8,255,618 B1 | 8/2012 | Borchers et al. |
| 8,321,627 B1 | 11/2012 | Norrie et al. |
| 8,429,498 B1 | 4/2013 | Anholt et al. |
| 8,479,080 B1 | 7/2013 | Shalvi et al. |
| 8,539,139 B1 | 9/2013 | Morris |
| 8,595,590 B1 | 11/2013 | Vojcic et al. |
| 8,825,967 B2 | 9/2014 | Hong Beom |
| 8,874,836 B1 | 10/2014 | Hayes et al. |
| 8,886,872 B1 | 11/2014 | Norrie |
| 8,924,661 B1 | 12/2014 | Shachar et al. |
| 8,984,376 B1 | 3/2015 | Norrie |
| 9,128,825 B1 | 9/2015 | Albrecht et al. |
| 9,170,876 B1 | 10/2015 | Bates et al. |
| 9,176,971 B2 | 11/2015 | Shapiro |
| 2003/0115403 A1 | 6/2003 | Bouchard et al. |
| 2003/0122834 A1* | 7/2003 | Mastronarde ........... G06F 13/18 345/535 |
| 2004/0117441 A1 | 6/2004 | Liu et al. |
| 2005/0144361 A1 | 6/2005 | Gonzalez et al. |
| 2005/0248992 A1 | 11/2005 | Hwang et al. |
| 2007/0002629 A1 | 1/2007 | Lee et al. |
| 2007/0233937 A1 | 10/2007 | Coulson et al. |
| 2008/0140914 A1 | 6/2008 | Jeon |
| 2008/0147994 A1 | 6/2008 | Jeong et al. |
| 2008/0295094 A1 | 11/2008 | Korupolu et al. |
| 2009/0168525 A1 | 7/2009 | Olbrich et al. |
| 2009/0177943 A1 | 7/2009 | Silvus et al. |
| 2009/0222627 A1 | 9/2009 | Reid |
| 2009/0282191 A1 | 11/2009 | Depta |
| 2010/0005217 A1 | 1/2010 | Jeddeloh |
| 2010/0014364 A1 | 1/2010 | Laberge et al. |
| 2010/0082879 A1 | 4/2010 | McKean et al. |
| 2010/0165730 A1 | 7/2010 | Sommer et al. |
| 2010/0174845 A1 | 7/2010 | Gorobets et al. |
| 2010/0174853 A1 | 7/2010 | Lee et al. |
| 2010/0220509 A1 | 9/2010 | Sokolov et al. |
| 2010/0250874 A1* | 9/2010 | Farrell .................. G06F 13/161 711/155 |
| 2011/0113204 A1 | 5/2011 | Henriksson et al. |
| 2011/0138100 A1 | 6/2011 | Sinclair |
| 2011/0235434 A1 | 9/2011 | Byom et al. |
| 2011/0252215 A1 | 10/2011 | Franceschini et al. |
| 2011/0264851 A1 | 10/2011 | Jeon et al. |
| 2011/0302474 A1 | 12/2011 | Goss et al. |
| 2012/0030408 A1 | 2/2012 | Flynn et al. |
| 2012/0047317 A1 | 2/2012 | Yoon et al. |
| 2012/0159070 A1 | 6/2012 | Baderdinni et al. |
| 2012/0198129 A1 | 8/2012 | Van Aken et al. |
| 2012/0224425 A1 | 9/2012 | Fai et al. |
| 2012/0278530 A1 | 11/2012 | Ebsen |
| 2012/0324180 A1 | 12/2012 | Asnaashari et al. |
| 2013/0007380 A1 | 1/2013 | Seekins et al. |
| 2013/0070507 A1 | 3/2013 | Yoon |
| 2013/0111112 A1 | 5/2013 | Jeong et al. |
| 2013/0111289 A1 | 5/2013 | Zhang et al. |
| 2013/0111290 A1 | 5/2013 | Zhang et al. |
| 2013/0132650 A1 | 5/2013 | Choi et al. |
| 2013/0182506 A1 | 7/2013 | Melik-Martirosian |
| 2013/0219106 A1 | 8/2013 | Vogan et al. |
| 2013/0232290 A1 | 9/2013 | Ish et al. |
| 2013/0254498 A1 | 9/2013 | Adachi et al. |
| 2013/0262745 A1 | 10/2013 | Lin et al. |
| 2013/0297894 A1 | 11/2013 | Cohen et al. |
| 2013/0346805 A1 | 12/2013 | Sprouse et al. |
| 2014/0006688 A1 | 1/2014 | Yu et al. |
| 2014/0013026 A1 | 1/2014 | Venkata et al. |
| 2014/0047170 A1 | 2/2014 | Cohen et al. |
| 2014/0075100 A1 | 3/2014 | Kaneko et al. |
| 2014/0143637 A1 | 5/2014 | Cohen et al. |
| 2014/0173239 A1 | 6/2014 | Schushan |
| 2014/0229655 A1 | 8/2014 | Goss et al. |
| 2014/0229656 A1 | 8/2014 | Goss et al. |
| 2014/0241071 A1 | 8/2014 | Goss et al. |
| 2014/0244897 A1 | 8/2014 | Goss et al. |
| 2014/0258598 A1 | 9/2014 | Canepa et al. |
| 2014/0281833 A1 | 9/2014 | Kroeger et al. |
| 2014/0310241 A1 | 10/2014 | Goyen |
| 2014/0379988 A1 | 12/2014 | Lyakhovitskiy et al. |
| 2015/0067172 A1 | 3/2015 | Ashokan et al. |
| 2015/0074487 A1 | 3/2015 | Patapoutian et al. |
| 2015/0095558 A1 | 4/2015 | Kim et al. |
| 2015/0186278 A1 | 7/2015 | Jayakumar et al. |
| 2015/0234612 A1 | 8/2015 | Himelstein et al. |
| 2015/0261473 A1 | 9/2015 | Matsuyama et al. |
| 2015/0262632 A1 | 9/2015 | Shelton et al. |
| 2015/0301749 A1 | 10/2015 | Seo et al. |
| 2015/0331627 A1 | 11/2015 | Kwak |
| 2016/0026386 A1 | 1/2016 | Ellis et al. |
| 2016/0034194 A1 | 2/2016 | Brokhman et al. |
| 2016/0062699 A1 | 3/2016 | Samuels et al. |
| 2016/0070493 A1 | 3/2016 | Oh et al. |
| 2016/0071612 A1 | 3/2016 | Takizawa et al. |
| 2016/0117099 A1 | 4/2016 | Prins et al. |
| 2016/0117102 A1 | 4/2016 | Hong et al. |
| 2016/0117105 A1 | 4/2016 | Thangaraj et al. |
| 2016/0117252 A1 | 4/2016 | Thangaraj et al. |
| 2016/0170671 A1 | 6/2016 | Huang |
| 2016/0170831 A1 | 6/2016 | Lesartre et al. |
| 2016/0179403 A1 | 6/2016 | Kurotsuchi et al. |
| 2016/0299689 A1 | 10/2016 | Kim et al. |
| 2016/0299699 A1 | 10/2016 | Vanaraj et al. |
| 2016/0299704 A1 | 10/2016 | Vanaraj et al. |
| 2016/0299724 A1 | 10/2016 | Vanaraj et al. |
| 2016/0342344 A1 | 11/2016 | Kankani et al. |
| 2016/0342345 A1 | 11/2016 | Kankani et al. |
| 2016/0371394 A1 | 12/2016 | Shahidi et al. |

OTHER PUBLICATIONS

International Search Report and Written Opinion dated Nov. 9, 2015, received in International Patent Application No. PCT/US2015/053551, which corresponds to U.S. Appl. No. 14/668,690, 12 pages (Thangaraj).

International Search Report and Written Opinion dated Nov. 11, 2015, received in International Patent Application No. PCT/US2015/053582, which corresponds to U.S. Appl. No. 14/659,493, 12 pages (Prins).

International Search Report and Written Opinion dated Jul. 4, 2016, received in International Patent Application No. PCT/US2016/028477, which corresponds to U.S. Appl. No. 14/883,540, 11 pages (Hodgdon).

Atmel Data-sheet, "9-to-bit Selectable, ±0.5° C. Accurate Digital Temperature Sensor with Nonvolatile Registers and Serial EEPROM" www.atmel.com/images/Atmel-8854-DTS-AT30TSE752A-754A-758A-Datasheet.pdf, Atmel Data-sheet, Mar. 1, 2011,—Atmel-8854-DTS-AT30TSE752A-754A-758A-Datasheet_102014, 57 pages.

Seagate Technology, "SCSI Commands Reference Manual, Rev. C", Product Manual dated Apr. 2010, pp. 211-214.

Tanenbaum, "Structured Computer Organization", 3rd edition 1990, section 1.4, p. 11, 3 pages.

International Search Report and Written Opinion dated Sep. 8, 2016, received in International Patent Application No. PCT/US2016/

(56) References Cited

OTHER PUBLICATIONS 036716, which corresponds to U.S. Appl. No. 14/925,945, 13 pages (Ellis).

\* cited by examiner

408 — After starting the first timer, in accordance with a determination that the first timer has expired, perform one or more operations in the non-volatile memory system including:

412 — In accordance with a determination that the second queue contains at least one memory operation for execution, performing one or more operations including: (1) suspending the first memory operation from the first queue, (2) executing a second memory operation from the second queue, and (3) after completing execution of the second memory operation from the second queue, performing one or more subsequent operations (C)

456 — The one or more subsequent operations include: (1) restarting the first timer, and (2) resuming execution of the first memory operation from the first queue.

SUSPENDING AND RESUMING NON-VOLATILE MEMORY OPERATIONS

RELATED APPLICATIONS

This application claims priority to U.S. Provisional Patent Application No. 62/027,712, filed Jul. 22, 2014, which is hereby incorporated by reference in its entirety.

TECHNICAL FIELD

The disclosed embodiments relate generally to memory systems, and in particular, to management and suspension of flash memory operations.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information. Increases in storage density have been facilitated in various ways, including increasing the density of memory cells on a chip enabled by manufacturing developments, and transitioning from single-level flash memory cells to multi-level flash memory cells, so that two or more bits can be stored by each flash memory cell.

Since flash memory may be subject to quality of service constraints on the execution of memory operations (e.g., a device may be required to respond to at least a predefined percentage, such as 99 percent, of read operations within a prescribed time limit, such as 2 ms), it is important to optimize memory management processes to accommodate these constraints.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to enable management and suspension of flash memory operations. In one aspect, a first memory operation from a first queue is executed in conjunction with starting a timer, and in accordance with a determination that the timer has expired, one or more operations are performed, including determining whether a second queue contains a second memory operation, and if so, suspending the first memory operation and executing the second memory operation.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIGS. 4A-4G illustrate a flowchart representation of a management and suspension method, in accordance with some embodiments.

Figure 1:
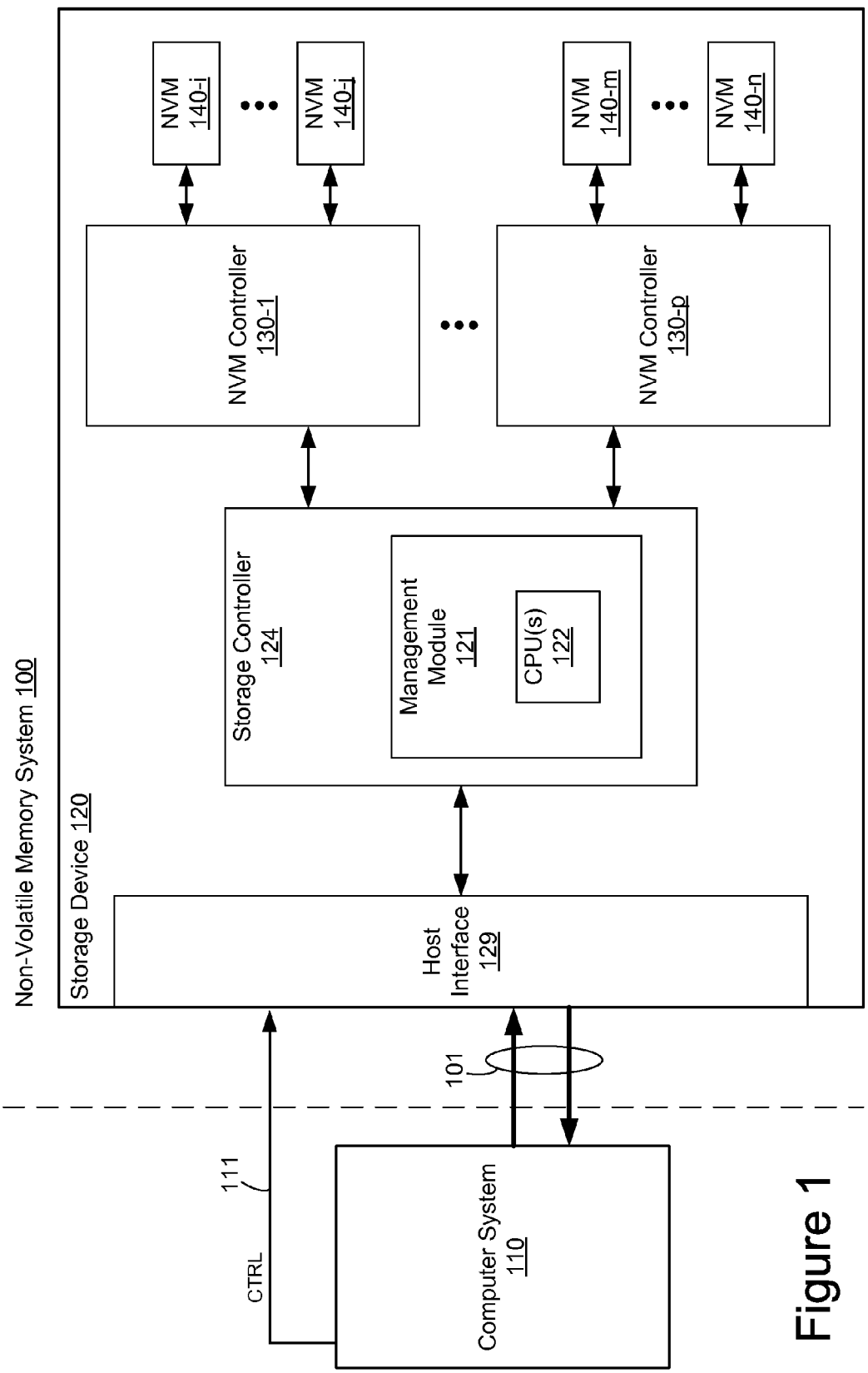
FIG. 1 is a block diagram illustrating a non-volatile memory system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to enable management and suspension of flash memory operations. Some implementations include systems, methods and/or devices to execute a first memory operation from a first queue in conjunction with starting a timer (e.g., concurrently with starting the timer), and in accordance with a determination that the timer has expired, perform one or more operations, including determining whether a second queue contains a second memory operation, and if so, suspending the first memory operation and executing the second memory operation.

More specifically, some embodiments include a method of operation in a non-volatile memory system. In some embodiments, the method includes: (1) starting, in the non-volatile memory system, execution of a first memory operation from a first queue, (2) in conjunction with starting execution of the first memory operation, starting a first timer in the non-volatile memory system, wherein the first timer is set to expire after a first predetermined time interval, and (3) after starting the first timer, in accordance with a determination that the first timer has expired, performing one or more operations in the non-volatile memory system including determining whether a second queue contains at least one memory operation for execution. In these embodiments, the method further includes, in accordance with a determination that the second queue contains at least one memory operation for execution, performing one or more operations including (i) suspending the first memory operation from the first queue, (ii) executing a second memory operation from the second queue, and (iii) after completing execution of the second memory operation from the second queue, performing one or more subsequent operations. In addition, in these embodiments, the method further includes, in accordance with a determination that the second queue does not contain at least one memory operation for execution, performing one or more operations including (i) restarting the first timer, and (ii) continuing execution of the first memory operation from the first queue.

In some embodiments, the first queue is a normal job queue for storing normal priority memory operations awaiting execution, and the second queue is a high priority job queue for storing high priority memory operations awaiting execution.

In some embodiments, the method includes assigning the first timer to the first memory operation from a plurality of timers.

In some embodiments, the one or more subsequent operations include (1) restarting the first timer, and (2) resuming execution of the first memory operation from the first queue.

In some embodiments, read operations from a host system are placed in the second queue.

In some embodiments, the first queue and the second queue are logical queues, and both the first queue and the second queue are part of a single physical queue.

In some embodiments, the first queue and the second queue are distinct physical queues.

In some embodiments, the non-volatile memory system includes a global indicator that when set indicates that memory operations in the first queue cannot be suspended, and the method further includes (1) setting the global indicator in accordance with a predefined condition or command, and (2) in accordance with a determination that the global indicator is set, preventing suspension of memory operations in the first queue.

In some embodiments, the method further includes, in accordance with each of one or more subsequent determinations that the first timer has expired, performing one or more operations including (1) determining whether the second queue contains at least one memory operation for execution, (2) in accordance with a determination that the second queue contains at least one memory operation for execution, performing one or more operations including (a) suspending the first memory operation from the first queue, (b) executing a memory operation (sometimes called a respective memory operation) from the second queue, and (c) after completing execution of the memory operation from the second queue, performing one or more subsequent operations including (i) restarting the first timer, and (ii) resuming execution of the first memory operation from the first queue, and (3) in accordance with a determination that the second queue does not contain at least one memory operation for execution, performing one or more operations including (a) restarting the first timer, and (b) continuing execution of the first memory operation from the first queue.

In some embodiments, the method further includes: (1) starting, in the non-volatile memory system, execution of a third memory operation from the first queue, (2) in conjunction with starting execution of the third memory operation, starting a second timer in the non-volatile memory system, wherein the second timer is set to expire after a second predetermined time interval, and (3) after starting the second timer, in accordance with a determination that the second timer has expired, performing one or more operations in the non-volatile memory system including determining whether the second queue contains at least one memory operation for execution. In these embodiments, the method further includes, in accordance with a determination that the second queue contains at least one memory operation for execution, performing one or more operations including (i) suspending the third memory operation from the first queue, (ii) executing a fourth memory operation from the second queue, and (iii) after completing execution of the fourth memory operation from the second queue, performing one or more subsequent operations including (aa) restarting the second timer, and (bb) resuming execution of the third memory operation from the first queue. In addition, in these embodiments, the method further includes, in accordance with a determination that the second queue does not contain at least one memory operation for execution, performing one or more operations including (i) restarting the second timer, and (ii) continuing execution of the third memory operation from the first queue.

In some embodiments, the second predetermined time interval is distinct from the first predetermined time interval.

In some embodiments, the method further includes determining whether a memory operation in the first queue subsequent to the first memory operation includes a respective indicator, and in accordance with a determination that the respective indicator of the subsequent memory operation is set, preventing suspension of the subsequent memory operation.

In some embodiments, the method further includes, in accordance with a determination that an indicator of the subsequent memory operation is set, preventing suspension of the subsequent memory operation.

In some embodiments, the non-volatile memory system includes a plurality of portions, each portion having one or more non-volatile memory devices, a (respective) first queue, a (respective) second queue, and a portion-specific indicator that when set indicates that memory operations in the first queue cannot be suspended, and the method further includes, in accordance with a determination that the portion-specific indicator for a first portion (sometimes called a respective portion) of the non-volatile memory system is set, preventing suspension of memory operations in the first queue of the first portion of the non-volatile memory system.

In some embodiments, the non-volatile memory system includes a global indicator that when set indicates that memory operations in the respective first queues of the plurality of portions of the non-volatile memory system cannot be suspended, and the method further includes (1) setting the global indicator in accordance with a predefined condition or command, and (2) in accordance with a determination that the global indicator is set, preventing suspension of memory operations in the respective first queues of the plurality of portions of the non-volatile memory system.

In some embodiments, the non-volatile memory system includes one or more flash memory devices.

In some embodiments, the non-volatile memory system includes one or more three-dimensional (3D) memory devices and circuitry associated with operation of memory elements in the one or more 3D memory devices.

In some embodiments, the circuitry and one or more memory elements in a respective 3D memory device, of the one or more 3D memory devices, are on the same substrate.

In another aspect, any of the methods described above are performed by a non-volatile memory system, the non-volatile memory system including (1) one or more processors, and (2) memory storing one or more programs, which when executed by the one or more processors cause the non-volatile memory system to perform or control performance of any of the methods described herein.

In yet another aspect, any of the methods described above are performed by a non-volatile memory system including a plurality of portions, each portion having one or more non-volatile memory devices, wherein for each portion, the non-volatile memory system includes: (1) one or more timers, (2) a first queue and a second queue, and (3) a logic module, wherein the logic module is configured to perform or control performance of any of the methods described herein.

In yet another aspect, any of the methods described above are performed by a non-volatile memory system including means for performing any of the methods described herein.

In yet another aspect, some embodiments include a non-transitory computer readable storage medium, storing one or more programs configured for execution by one or more processors of a non-volatile memory system, the one or more programs including instructions for performing any of the methods described herein.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as to not unnecessarily obscure more pertinent aspects of the implementations described herein.

FIG. 1 is a block diagram illustrating an implementation of non-volatile memory system 100, in accordance with some embodiments. While some example features are illustrated, various other features have not been illustrated for the sake of brevity and so as not to obscure more pertinent aspects of the example implementations disclosed herein. To that end, as a non-limiting example, non-volatile memory system 100 includes a storage device 120, which includes host interface 129, storage controller 124, non-volatile memory (NVM) controllers 130 (e.g., NVM controller 130-1 through NVM controller 130-$p$), and non-volatile memory (NVM) (e.g., one or more NVM device(s) 140 such as one or more flash memory devices), and is used in conjunction with a computer system 110.

Computer system 110 is coupled to storage device 120 through data connections 101. However, in some embodiments computer system 110 includes storage controller 124 as a component and/or a sub-system. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host or host system. In some embodiments, computer system 110 includes one or more processors, one or more types of memory, a display and/or other user interface components such as a keyboard, a touch screen display, a mouse, a track-pad, a digital camera and/or any number of supplemental devices to add functionality. Further, in some embodiments, computer system 110 sends one or more host commands (e.g., read commands and/or write commands) on control line 111 to storage device 120. In some embodiments, computer system 110 is a server system, such as a server system in a data center, and does not have a display and other user interface components.

In some embodiments, storage device 120 includes host interface 129, storage controller 124, NVM controllers 130 (e.g., NVM controllers 130-1 through 130-$p$), and NVM devices 140 (e.g., NVM devices 140-$i$ through 140-$j$ and NVM devices 140-$m$ through 140-$n$). Storage device 120 may include various additional features that have not been illustrated for the sake of brevity and so as not to obscure more pertinent features of the example implementations disclosed herein, and a different arrangement of features may be possible. Host interface 129 provides an interface to computer system 110 through data connections 101.

In some embodiments, each NVM controller 130 include one or more processing units (sometimes called CPUs or processors or microprocessors or microcontrollers) configured to execute instructions in one or more programs (e.g., in NVM controllers 130). NVM devices 140 are coupled with NVM controllers 130 through connections that typically convey commands in addition to data, and optionally convey metadata, error correction information and/or other information in addition to data values to be stored in NVM devices 140 and data values read from NVM devices 140. In some implementations, storage device 120 is configured for enterprise storage suitable for applications such as cloud computing, or for caching data stored (or to be stored) in secondary storage, such as hard disk drives. Alternatively, storage device 120 is configured for relatively smaller-scale applications such as personal flash drives or hard-disk replacements for personal, laptop and tablet computers. Although flash memory devices and flash controllers are used as an example here, in some embodiments storage device 120 includes other non-volatile memory device(s) and corresponding non-volatile memory controller(s). In some embodiments, storage device 120 includes one or more three-dimensional (3D) memory devices, as further defined herein.

The combination of one or more NVM devices 140 (e.g., NVM devices 140-$i$ through 140-$j$ or NVM devices 140-$m$ through 140-$n$) and a corresponding NVM controller 130 (e.g., NVM controller 130-1 or NVM controller 130-$p$, respectively) is sometimes referred to as a portion, or non-volatile memory portion, sometimes herein called a memory channel. Non-volatile memory system 100 can include as many portions as there are distinct sets of NVM devices to which commands can be dispatched in parallel by a set of NVM controllers.

In some embodiments, storage device 120 includes a single NVM device (e.g., a single flash memory device) while in other embodiments storage device 120 includes a plurality of NVM devices (e.g., a plurality of flash memory devices). In some embodiments, NVM devices 140 include NAND-type flash memory or NOR-type flash memory. Further, in some embodiments, NVM controller 130 is a solid-state drive (SSD) controller. However, one or more other types of storage media may be included in accordance with aspects of a wide variety of implementations. In some embodiments, storage device 120 is or includes a dual in-line memory module (DIMM) device. In some embodiments, storage device 120 is compatible with a DIMM memory slot. In some embodiments, memory controller 120 and the host interface use a defined interface standard for communication, such as double data rate type three synchronous dynamic random access memory (DDR3). In some embodiments, the defined interface standard for communication used by memory controller 120 and the host interface is serial advance technology attachment (SATA). In some other implementations, the defined interface standard for communication used by memory controller 120 and the host interface is SAS (serial attached SCSI), or any other suitable storage interface standard.

In some embodiments, storage controller 124 includes a management module 121. Storage controller 124 is typically coupled with host interface 129 and NVM controllers 130 in order to coordinate the operation of these components. Storage controller 124 may include various additional features that have not been illustrated for the sake of brevity and so as not to obscure more pertinent features of the example implementations disclosed herein, and a different arrangement of features may be possible.

In some embodiments, management module 121 includes one or more processing units (CPUs, also sometimes called processors) 122 configured to execute instructions in one or more programs (e.g., in management module 121). In some embodiments, the one or more CPUs 122 are shared by one or more components within, and in some cases, beyond the function of storage controller 124.

In some implementations, however, storage controller 124, NVM controllers 130 and NVM devices 140 are included in the same device as components thereof. Furthermore, in some implementations storage controller 124, NVM controllers 130 and NVM devices 140 are embedded in a host device, such as a server system, mobile device, tablet, other computer or computer controlled device, and the methods described herein are performed by the embedded memory controller.

Figure 2A:
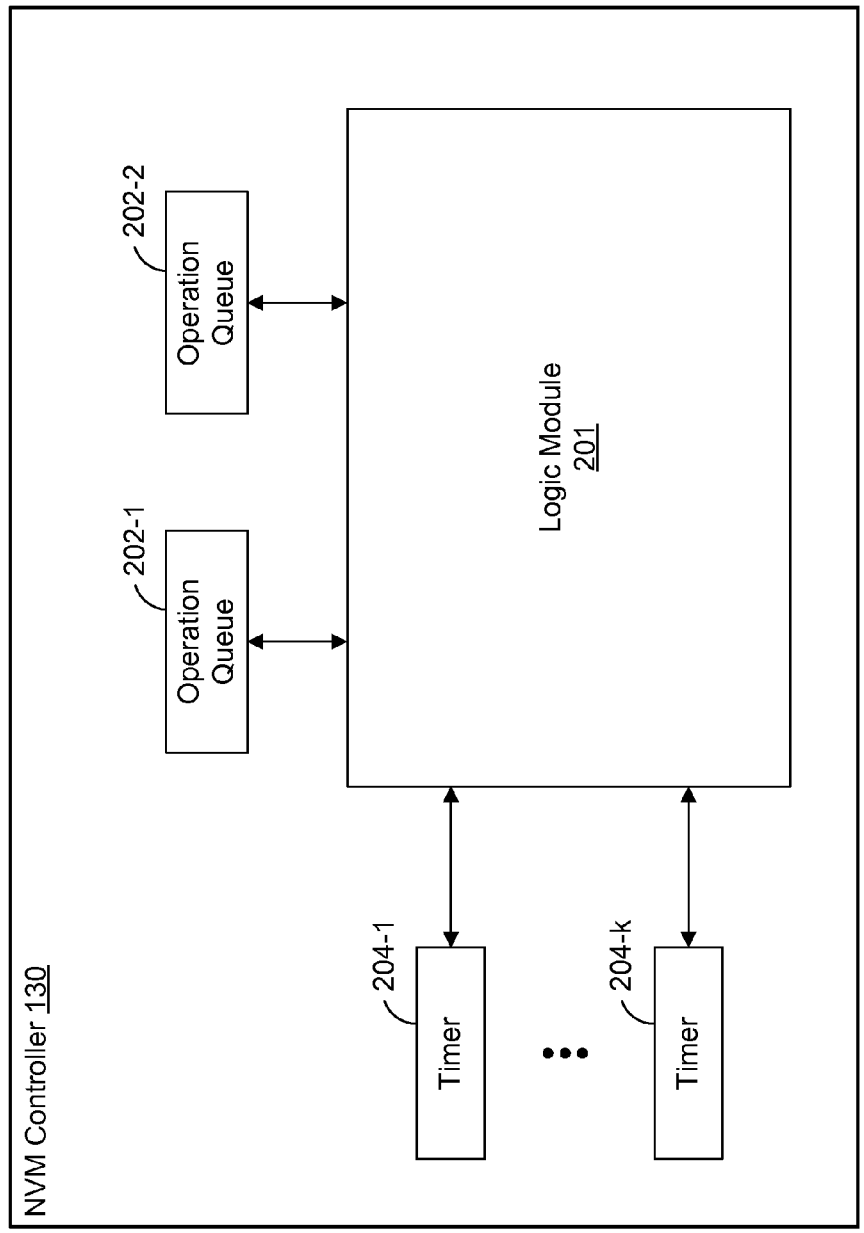
FIG. 2A is a block diagram illustrating a non-volatile memory controller included in FIG. 1, in accordance with some embodiments.

FIG. 2A is a block diagram illustrating an implementation of NVM controller 130 included in FIG. 1, in accordance with some embodiments. While some example features are illustrated, various other features have not been illustrated for the sake of brevity and so as not to obscure more pertinent aspects of the example implementations disclosed herein. To that end, as a non-limiting example, NVM controller 130 includes logic module 201, operation queues 202 (sometimes referred to as job queues), and timers 204.

In some embodiments, operation queues 202 in a respective NVM controller 130 are used to hold memory operations for execution by one or more NVM devices 140 coupled to the respective NVM controller 130. A respective operation queue 202, when not empty, contains one or more memory operations (or representations of those memory operations) corresponding to read, write, and/or erase operations for reading data from, writing data to, or erasing data from a corresponding set of NVM devices (e.g., NVM devices 140). In some embodiments, memory operations in operation queues 202 include memory operations received from a host system (e.g., computer system 110). For example, in some embodiments, operation queue 202-1 is a normal priority job queue containing one or more read, write, and/or erase operations, and operation queue 202-2 is a high priority job queue containing one or more read operations from a host system. In some embodiments, the normal priority job queue stores, while awaiting execution, all memory operations other than read operations received from a host system. Furthermore, in some embodiments, the normal priority queue contains internally generated memory operations, such as memory operations issued by a garbage collection process.

In some embodiments, timers 204 in a respective NVM controller 130 are used to count or track passage of time during the execution of one or more memory operations. In some embodiments, a respective timer (e.g., one of timers 204-1 through 204-k) is assigned from a plurality of timers to a respective memory operation from operation queues 202. In some embodiments, assigning the respective timer (e.g., one of timers 204-1 through 204-k) to a respective memory operation from operation queues 202 occurs in conjunction with (e.g., concurrently with) starting execution of the respective memory operation. In some embodiments, assigning the respective timer (e.g., one of timers 204-1 through 204-k) to the respective memory operation from operation queues 202 occurs prior to starting execution of the respective memory operation. In some embodiments, assigning the respective timer (e.g., one of timers 204-1 through 204-k) to the respective memory operation from operation queues 202 is in accordance with the operation type of the respective memory operation. For example, in some embodiments, when the operation type of a first memory operation is a write operation, a first timer is assigned to the first memory operation. In some embodiments, when the operation type of a second memory operation is an erase operation, a second timer is assigned to the second memory operation. In some embodiments, the first timer is set to expire after a first predetermined time interval, and the second timer is set to expire after a second predetermined time interval. In some embodiments, the first predetermined time interval is the same as the second predetermined time interval, while in some other embodiments, the first predetermined time interval is distinct from the second predetermined time interval.

In some embodiments, when the operation type of a respective memory operation is a write operation, a first timer from a first subset of timers is assigned to the respective memory operation, and when the operation type of the respective memory operation is an erase operation, a second timer from a second subset of timers is assigned to the respective memory operation. In some embodiments, when a timer from the first subset is assigned, it is set to expire after a first predetermined time interval, and when a timer from the second subset is assigned, it is set to expire after a second predetermined time interval. In some embodiments, the first predetermined time interval is the same as the second predetermined time interval. In some embodiments, the first predetermined time interval is distinct from the second predetermined time interval.

In some embodiments, a respective operation in operation queues 202 includes an identifier associated with a particular timer of timers 204. In some embodiments, the particular timer of timers 204 is assigned to the respective operation in accordance with the identifier.

Logic module 201 is coupled to operation queues 202, and includes logic for managing execution of memory operations in operation queues 202. For example, in some embodiments, logic module 201 is configured to determine whether operation queues 202 contain one or more memory operations for execution, manage execution of memory operations from operation queues 202, manage timers 204, and determine whether timers 204 have expired. In some embodiments, logic module 201 is configured to implement any of the methods described below with reference to FIGS. 3 and 4A-4G.

Although FIG. 2A shows two operation queues (e.g., operation queue 202-1 and operation queue 202-2), in other embodiments, NVM controller 130 includes one or more operation queues. In some embodiments, NVM controller 130 includes two logical operation queues, which are part of a single physical operation queue. In addition, in some embodiments, NVM controller 130 includes one timer for each NVM device (e.g., each of NVM devices 140-$i$ through 140-$j$ and NVM devices 140-$m$ through 140-$n$).

Figure 2B:
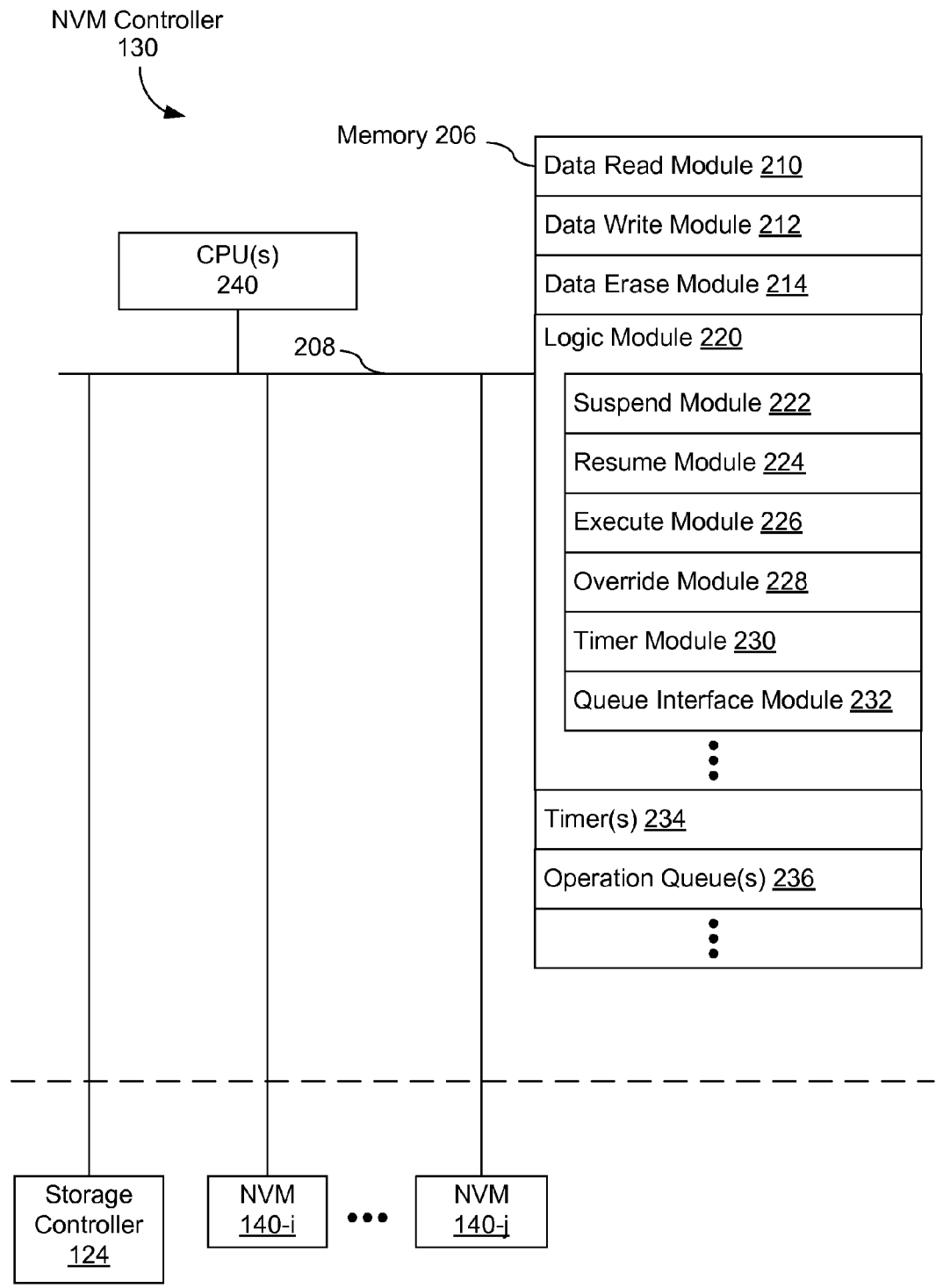
FIG. 2B is a block diagram illustrating a non-volatile memory controller included in FIG. 1, in accordance with some other embodiments.

FIG. 2B is a block diagram illustrating another implementation of NVM controller 130 included in FIG. 1, in accordance with some embodiments. NVM controller 130 includes one or more processing units (CPUs) 240 for executing modules, programs and/or instructions stored in memory 206 and thereby performing processing operations, memory 206, and one or more communication buses 208 for interconnecting these components. Communication buses 208 optionally include circuitry (sometimes called a chipset) that interconnects and controls communications between system components. NVM controller 130 is coupled to storage controller 124 and NVM devices 140 (e.g., NVM devices 140-*i* through 140-*j*) by communication buses 208. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from the CPU(s) 240. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset thereof:

- data read module 210 that is used for reading data from one or more NVM devices;
- data write module 212 that is used for writing data to one or more NVM devices;
- data erase module 214 that is used for erasing data from one or more NVM devices;
- logic module 220 that is used for managing and suspending execution of memory operations, optionally including:
  - suspend module 222 that is used for suspending one or more memory operations;
  - resume module 224 that is used for resuming one or more memory operations;
  - execute module 226 that is used for executing one or more memory operations;
  - override module 228 that is used for preventing suspension of one or more memory operations;
  - timer module 230 that is used for managing timers 234, including starting, stopping, and resetting timers 234, and determining whether timers 234 have expired;
  - queue interface module 232 that is used for determining whether operation queues 236 contain one or more memory operations for execution;
  - timers 234 that are used for counting or tracking passage of time during the execution of one or more memory operations; and
  - operation queues 236 that are used for holding memory operations for execution.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing any of the methods described below with reference to FIGS. 3 and 4A-4G.

Although FIG. 2B shows NVM controller 130 in accordance with some embodiments, FIG. 2B is intended more as a functional description of the various features which may be present in NVM controller 130 than as a structural schematic of the embodiments described herein. In practice, and as recognized by those of ordinary skill in the art, items shown separately could be combined and some items could be separated.

Figure 3:
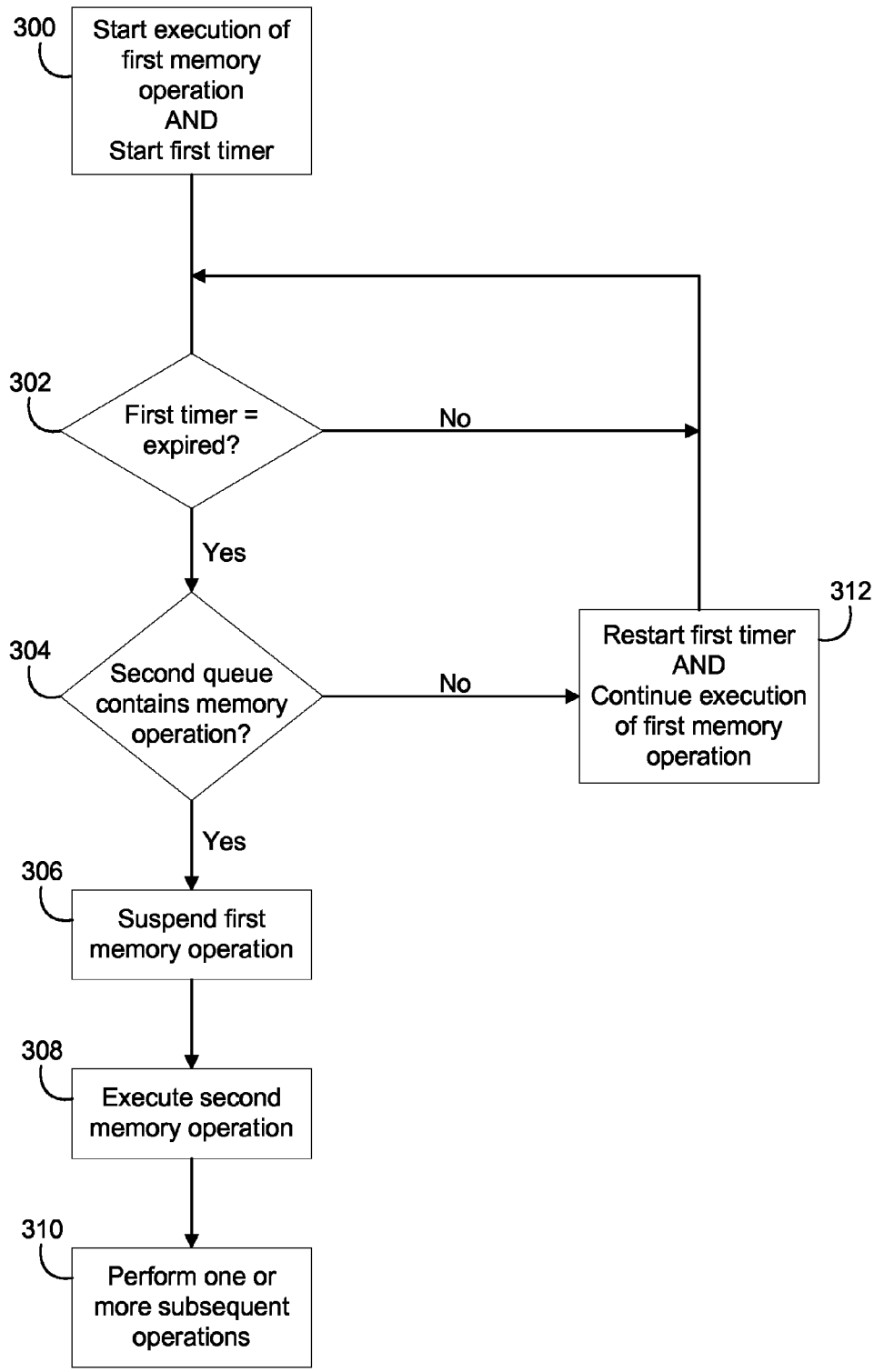
FIG. 3 is a flowchart representation illustrating the operation of a logic module, in accordance with some embodiments.
Figure 4A:
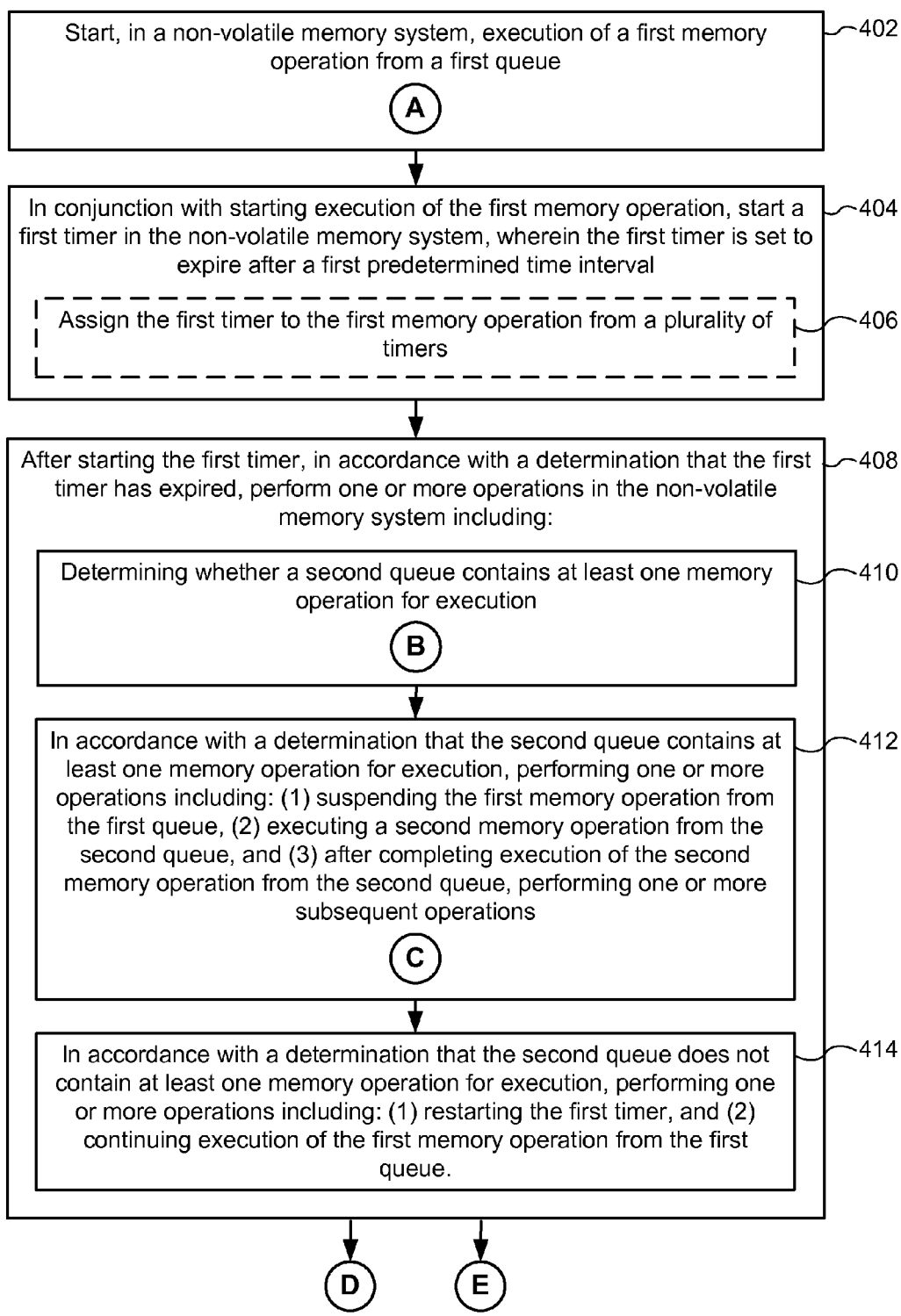
Figure 4B:
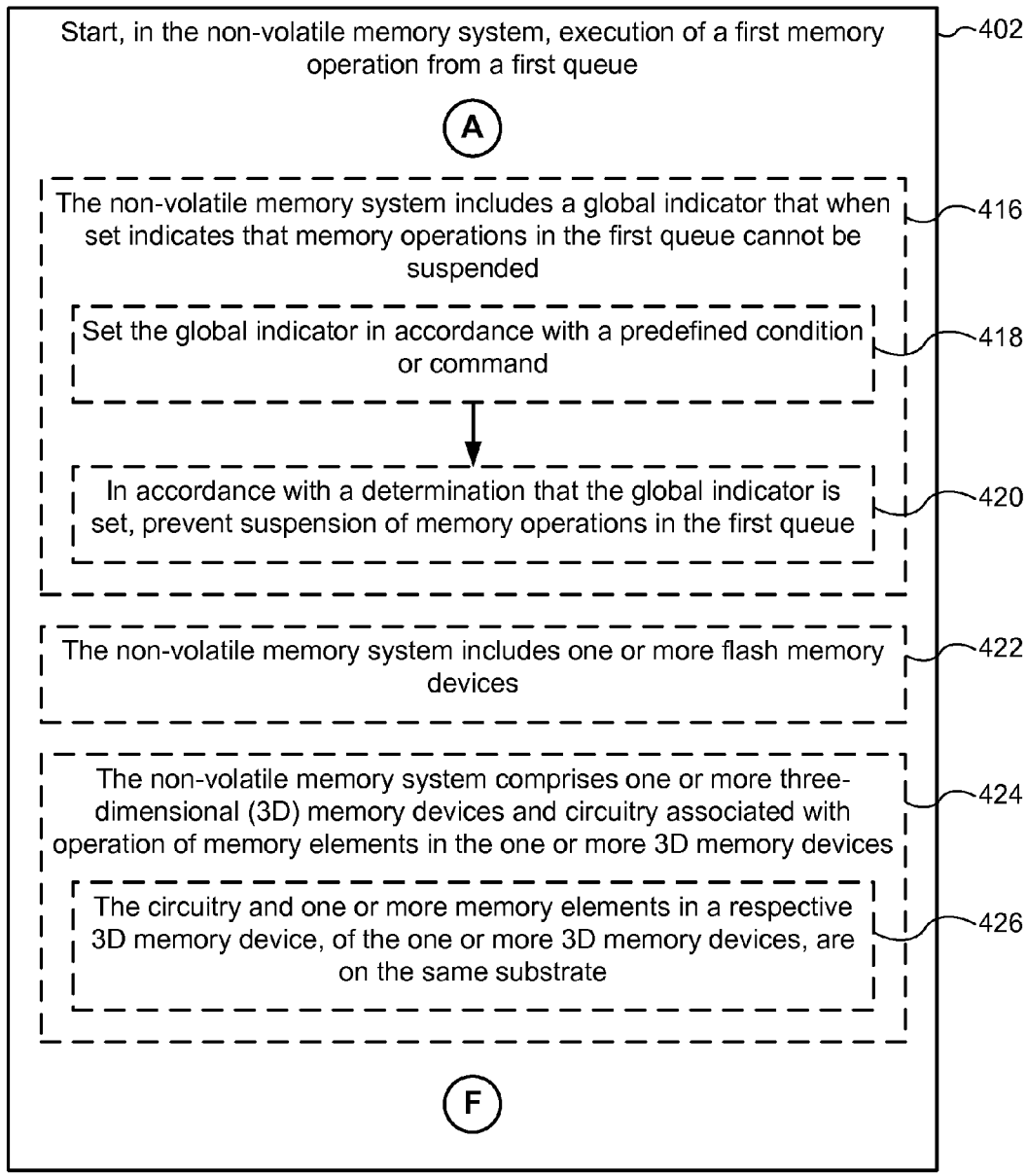
Figure 4C:
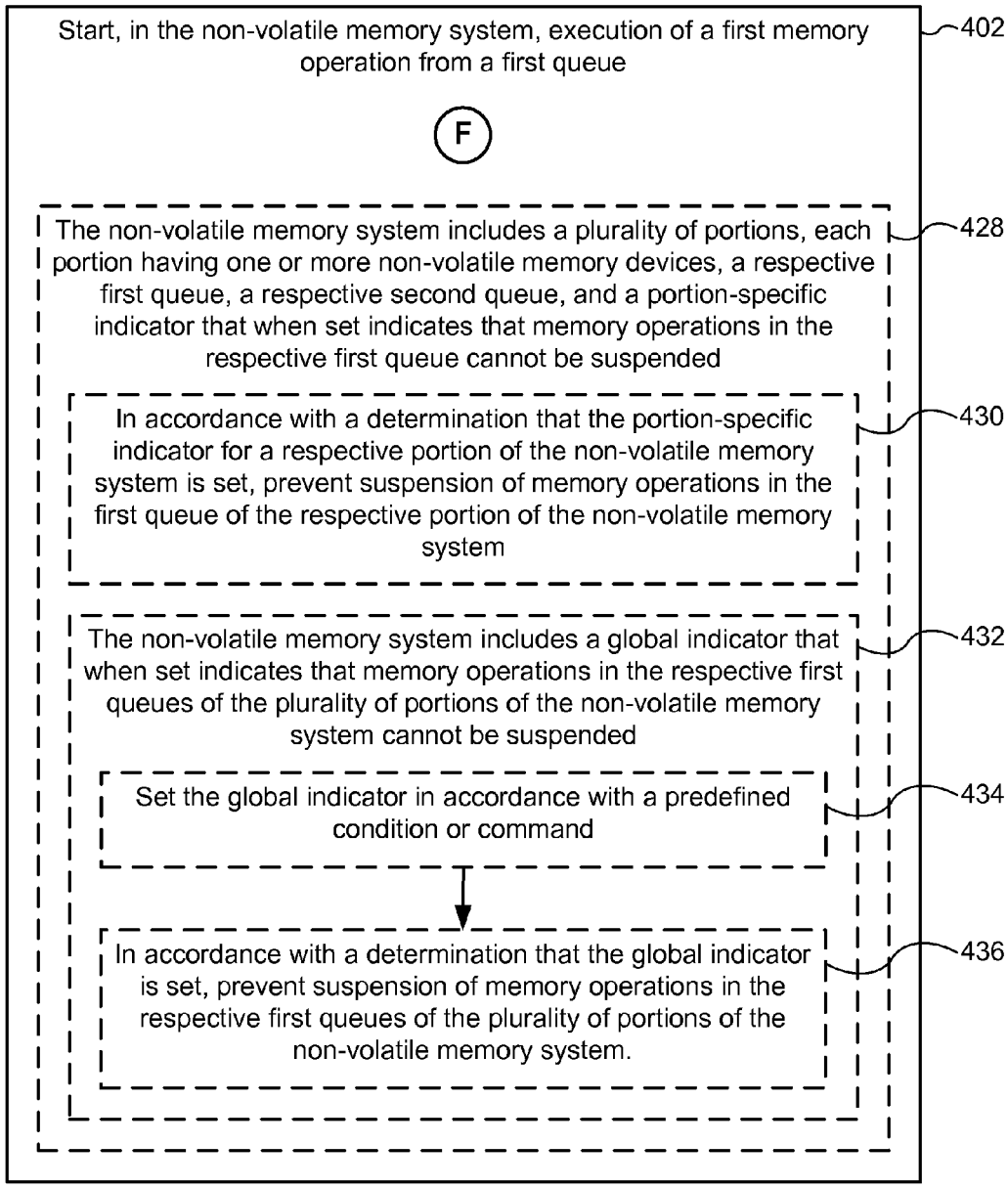
Figure 4D:
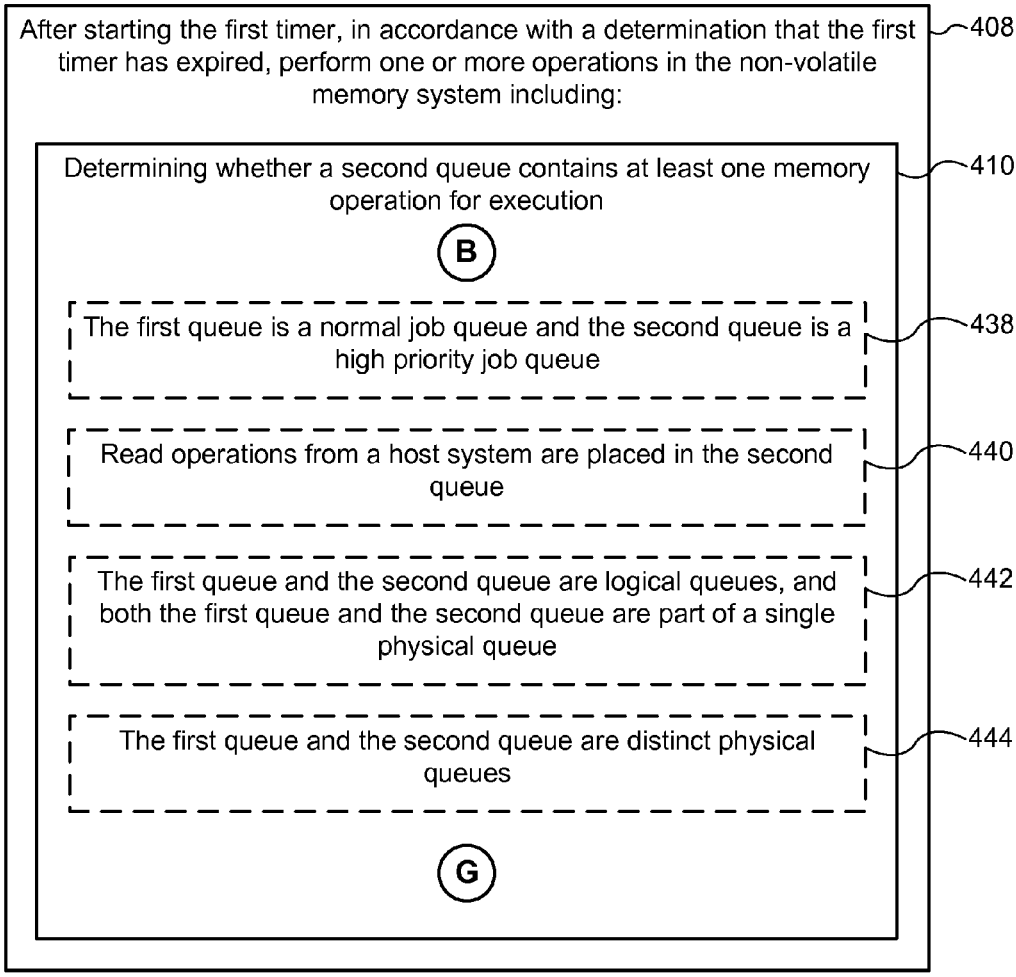
Figure 4E:
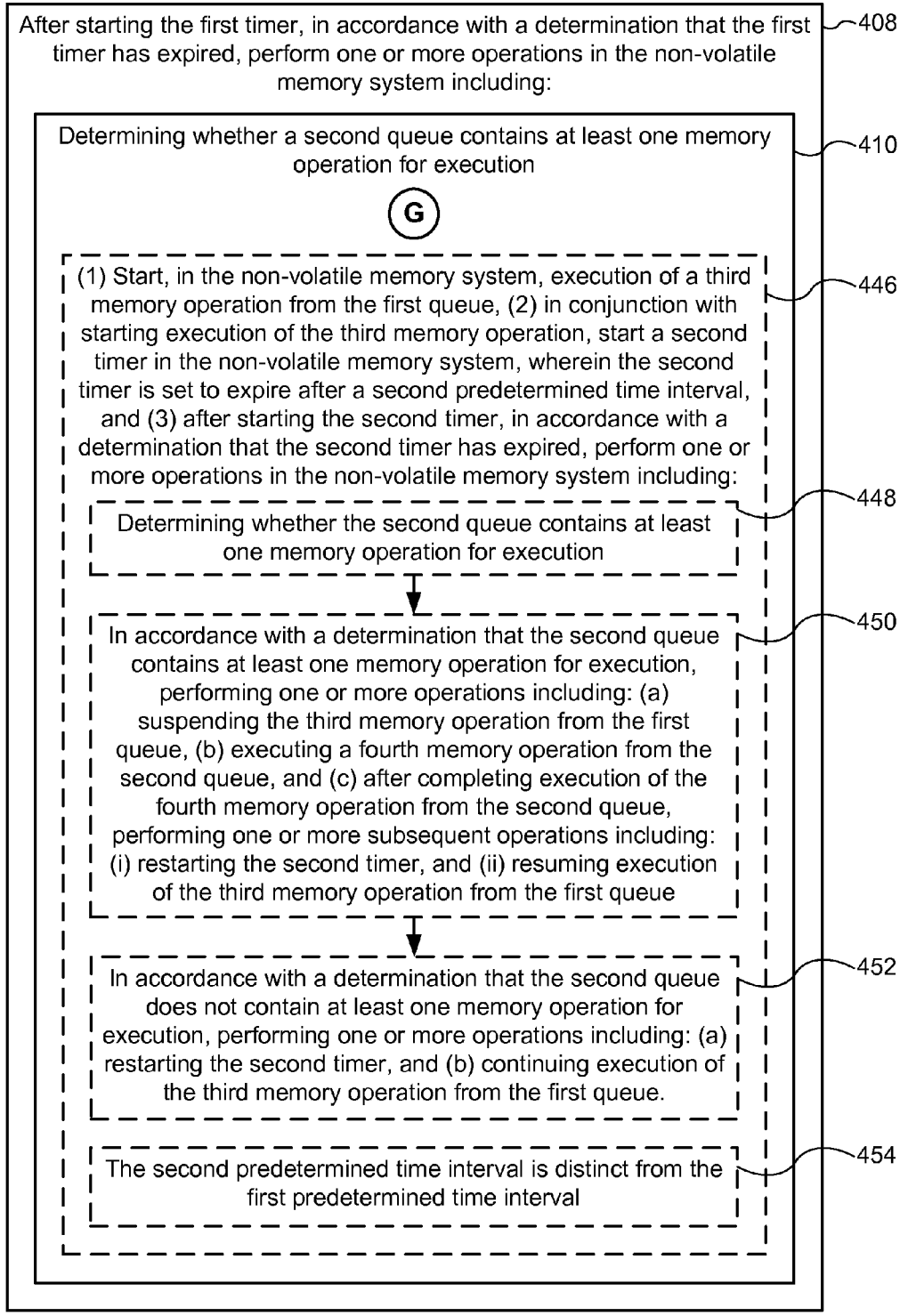
Figure 4G:
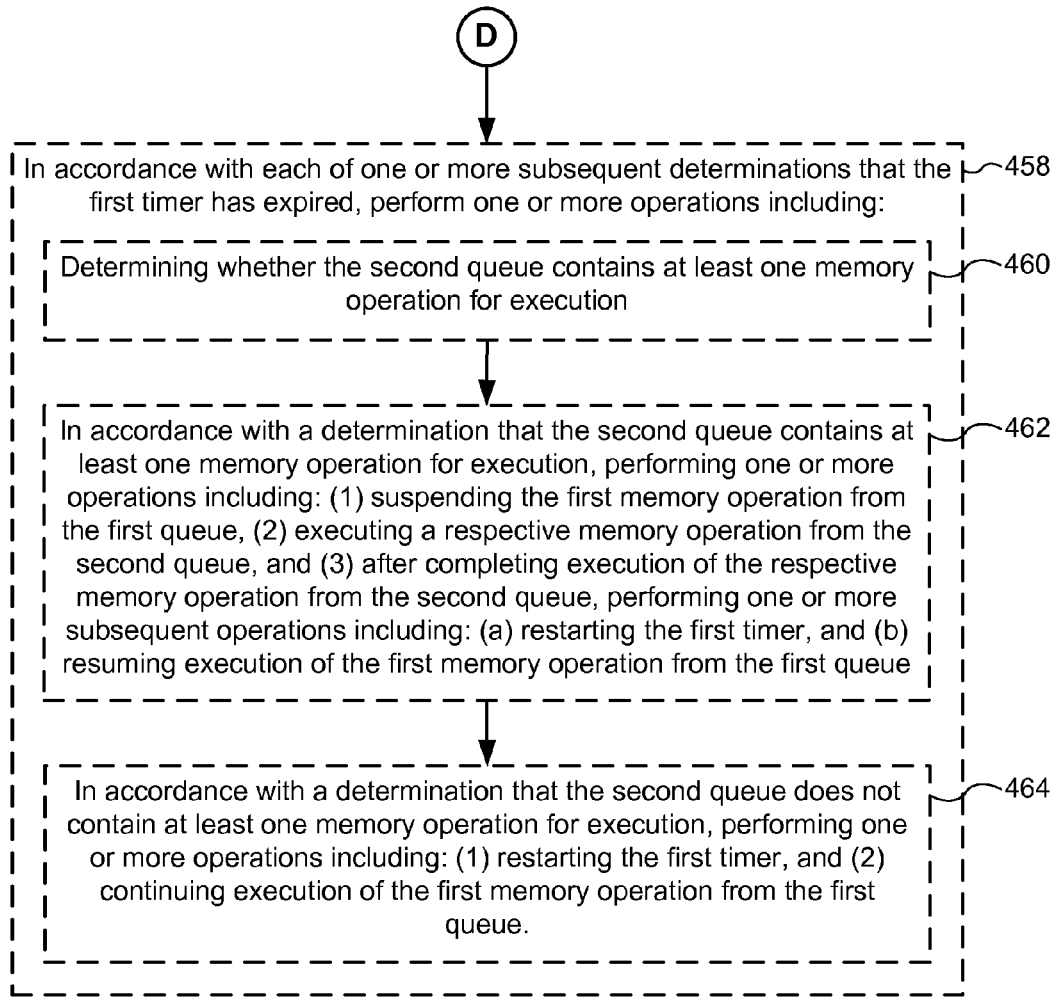
Figure 4G:
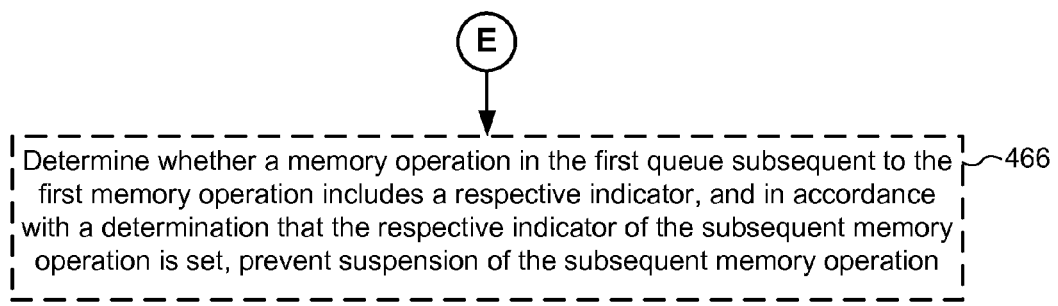

FIG. 3 is a flowchart representation illustrating the operation of a logic module, in accordance with some embodiments. In some embodiments, the operations of FIG. 3 are performed by logic module 201, FIG. 2A. In some embodiments, the operations of FIG. 3 are performed by logic module 220, FIG. 2B. For ease of explanation, the following describes FIG. 3 as performed by logic module 201, FIG. 2A.

In some embodiments, logic module 201 starts (300) execution of a first memory operation (e.g., a memory operation from a normal priority operation queue, such as queue 202-1, FIG. 2A) and starts a first timer (e.g., timer 204-1, FIG. 2A). Next, logic module 201 determines (302) whether the first timer has expired. If the first timer has not expired (302-No), logic module 201 continues to determine (302) whether the first timer has expired. If the first timer has expired (302-Yes), logic module 201 then determines (304) whether a second queue (e.g., a high priority operation queue, such as queue 202-2, FIG. 2A) contains a memory operation. If the second queue does not contain a memory operation (304-No), logic module 201 restarts (312) the first timer, continues execution of the first memory operation, and continues to determine (302) if the first timer has expired.

If the second queue contains a memory operation (304-Yes), logic module 201 suspends (306) the first memory operation, executes (308) a second memory operation from the second queue, and then performs (310) one or more subsequent operations. In some embodiments, performing (310) one or more subsequent operations includes restarting the first timer and resuming execution of the first operation. In some embodiments, each time the first timer is started or restarted during execution of the first memory operation, it is "set" to expire after a predetermined amount of time, such as 500 microseconds. Typically, execution of the first memory operation completes after a plurality (e.g., 3 to 10) of timer expirations. In some circumstances, such as circumstances in which the second queue contains multiple memory operations, execution of the first memory operation is interleaved with execution of two or more memory operations from the second queue.

FIGS. 4A-4G illustrate a flowchart representation of a management and suspension method, in accordance with some embodiments. At least in some embodiments, method 400 is performed by a storage device (e.g., storage device 120, FIG. 1) or one or more components of the storage device (e.g., storage controller 124 and/or NVM controllers 130, FIG. 1), wherein the storage device is operatively coupled with a host system (e.g., computer system 110, FIG. 1). In some embodiments, method 400 is governed by instructions that are stored in a non-transitory computer readable storage medium and that are executed by one or more processors of a device, such as the one or more processing units (CPUs) 122 of management module 121, shown in FIG. 1, or the one or more processing units (CPUs) 240 of NVM controller 130, shown in FIG. 2B. In some embodiments, method 400 is performed by a non-volatile memory system (e.g., non-volatile memory system 100, FIG. 1) or one or more components of the non-volatile memory system (e.g., computer system 110 and/or storage device 120, FIG. 1). In some embodiments, some of the operations of method 400 are performed at a host (e.g., computer system 110, FIG. 1) and information is transmitted to a storage device (e.g., storage device 120, FIG. 1). In some embodiments, method 400 is governed, at least in part, by instructions that are stored in a non-transitory computer readable storage medium and that are executed by one or more processors of a host (not shown in FIG. 1). For ease of explanation, the following describes method 400 as performed by a storage device (e.g., storage device 120, FIG. 1). However, those skilled in the art will appreciate that in other embodiments, one or more of the operations described in method 400 are performed by a host (e.g., computer system 110, FIG. 1).

A storage device (e.g., storage device 120, FIG. 1) starts (402), in a non-volatile memory system (e.g., non-volatile memory system 100, FIG. 1), execution of a first memory operation from a first queue (e.g., operation queue 202-1, FIG. 2A). In some embodiments, a logic module (e.g., logic module 201, FIG. 2A) is used to start execution of the first memory operation from the first queue. In some embodiments, an execute module (e.g., execute module 226, FIG. 2B) is used to start execution of the first memory operation from the first queue (e.g., a first operation queue 236, FIG. 2B).

The storage device, in conjunction with starting execution of the first memory operation, starts (404) a first timer in the non-volatile memory system, wherein the first timer is set to expire after a first predetermined time interval. In some embodiments, a logic module (e.g., logic module 201, FIG. 2A) is used to start the first timer (e.g., timer 204-1, FIG. 2A). In some embodiments, a timer module (e.g., timer module 230, FIG. 2B) is used to start the first timer (e.g., timer 234, FIG. 2B).

In some embodiments, the storage device assigns (406) the first timer (e.g., timer 204-1, FIG. 2A or one of timers 234, FIG. 2B) to the first memory operation from a plurality of timers (e.g., timers 204, FIG. 2A or timers 234, FIG. 2B). In some embodiments, a logic module (e.g., logic module 201, FIG. 2A) is used to assign the first timer, while in some embodiments, a timer module (e.g., timer module 230, FIG. 2B) is used to assign the first timer.

The storage device, after starting the first timer, in accordance with a determination that the first timer has expired, performs (408) one or more operations (sometimes referred to as a first set of operations) in the non-volatile memory system. In some embodiments, a logic module (e.g., logic module 201, FIG. 2A or logic module 220, FIG. 2B), after starting the first timer (e.g., timer 204-1, FIG. 2A or timer 234, FIG. 2B), in accordance with a determination that the first timer has expired, performs one or more operations in the non-volatile memory system.

The first set of operations includes determining (410) whether a second queue (e.g., operation queue 202-2, FIG. 2A or a second operation queue 236, FIG. 2B) contains at least one memory operation for execution. In some embodiments, a logic module (e.g., logic module 201, FIG. 2A) is used to determine whether the second queue contains at least one memory operation for execution, while in some embodiments, a queue interface module is used.

In some embodiments, the first queue (e.g., operation queue 202-1, FIG. 2A or a first operation queue 236, FIG. 2B) is (438) a normal priority job queue and the second queue (e.g., operation queue 202-2, FIG. 2A or a second operation queue 236, FIG. 2B) is a high priority job queue. In some embodiments, read operations from a host system (e.g., computer system 110, FIG. 1) are placed (440) in the second queue. In some embodiments, the first queue and the second queue are (442) logical queues, and both the first queue and the second queue are part of a single physical queue. In some embodiments, the first queue and the second queue are (444) distinct physical queues.

The first set of operations further includes, in accordance with a determination that the second queue (e.g., operation queue 202-2, FIG. 2A or a second operation queue 236, FIG. 2B) contains at least one memory operation for execution, performing (412) one or more operations (sometimes referred to as a second set of operations) including (1) suspending the first memory operation from the first queue, (2) executing a second memory operation from the second queue, and (3) after completing execution of the second memory operation from the second queue, performing one or more subsequent operations. In some embodiments, a logic module (e.g., logic module 201, FIG. 2A) is used to perform the second set of operations. In some embodiments, a suspend module (e.g., suspend module 222, FIG. 2B), an execute module (e.g., execute module 226, FIG. 2B) and/or a logic module (e.g., logic module 220, FIG. 2B) are used to perform the second set of operations.

In some embodiments, the one or more subsequent operations include (a) restarting (456) the first timer, and (b) resuming execution of the first memory operation from the first queue (e.g., operation queue 202-1, FIG. 2A or a first operation queue 236, FIG. 2B). In some embodiments, a logic module (e.g., logic module 201, FIG. 2A) is used to perform the one or more subsequent operations. In some embodiments, a timer module (e.g., timer module 230, FIG. 2B), a resume module (e.g., resume module 224, FIG. 2B) and/or a logic module (e.g., logic module 220, FIG. 2B) are used to perform the one or more subsequent operations.

The first set of operations further includes, in accordance with a determination that the second queue (e.g., operation queue 202-2, FIG. 2A or a second operation queue 236, FIG. 2B) does not contain at least one memory operation for execution, performing (414) one or more operations (sometimes referred to as a third set of operations) including (1) restarting the first timer, and (2) continuing execution of the first memory operation from the first queue. In some embodiments, a logic module (e.g., logic module 201, FIG. 2A) is used to perform the third set of operations. In some embodiments, a timer module (e.g., timer module 230, FIG. 2B), an execute module (e.g., execute module 226, FIG. 2B) and/or a logic module (e.g., logic module 220, FIG. 2B) are used to perform the third set of operations.

In some embodiments, the storage device, in accordance with each of one or more subsequent determinations that the first timer (e.g., timer 204-1, FIG. 2A or timer 234, FIG. 2B) has expired, performs (458) one or more operations including determining (460) whether the second queue (e.g., operation queue 202-2, FIG. 2A or a second operation queue 236, FIG. 2B) contains at least one memory operation for execution. In some embodiments, a logic module (e.g., logic module 201, FIG. 2A) and/or a queue interface module (e.g., queue interface module 232, FIG. 2B) is used to perform the one or more operations including determining whether the second queue contains at least one memory operation for execution.

In some embodiments, the storage device, in accordance with a determination that the second queue (e.g., operation queue 202-2, FIG. 2A or a second operation queue 236, FIG. 2B) contains at least one memory operation for execution, performs (462) one or more operations including (1) suspending the first memory operation from the first queue (e.g., operation queue 202-1, FIG. 2A or a first operation queue 236, FIG. 2B), (2) executing a respective memory operation from the second queue, and (3) after completing execution of the respective memory operation from the second queue, performing one or more subsequent operations including (a) restarting the first timer (e.g., timer 204-1, FIG. 2A or timer 234, FIG. 2B), and (b) resuming execution of the first memory operation from the first queue.

In addition, in these embodiments, the storage device, in accordance with a determination that the second queue does not contain at least one memory operation for execution, performs (464) one or more operations including (1) restarting the first timer, and (2) continuing execution of the first memory operation from the first queue.

In some embodiments, the storage device (1) starts (446), in the non-volatile memory system (e.g., non-volatile memory system 100, FIG. 1), execution of a third memory operation from the first queue (e.g., operation queue 202-1, FIG. 2A or a first operation queue 236, FIG. 2B), (2) in conjunction with starting execution of the third memory operation, starts a second timer (e.g., timer 204-$k$, FIG. 2A or a second timer 234, FIG. 2B) in the non-volatile memory system, wherein the second timer is set to expire after a second predetermined time interval, and (3) after starting the second timer, in accordance with a determination that the second timer has expired, performs one or more operations in the non-volatile memory system including determining (448) whether the second queue (e.g., operation queue 202-2, FIG. 2A or a second operation queue 236, FIG. 2B) contains at least one memory operation for execution. In addition, in these embodiments, the storage device, in accordance with a determination that the second queue contains at least one memory operation for execution, performs (450) one or more operations including: (a) suspending the third memory operation from the first queue, (b) executing a fourth memory operation from the second queue, and (c) after completing execution of the fourth memory operation from the second queue, performing one or more subsequent operations including (i) restarting the second timer, and (ii) resuming execution of the third memory operation from the first queue. In addition, in these embodiments, the storage device, in accordance with a determination that the second queue does not contain at least one memory operation for execution, performs (452) one or more operations including (a) restarting the second timer, and (b) continuing execution of the third memory operation from the first queue.

In some embodiments, the second predetermined time interval is (454) distinct from the first predetermined time interval.

In some embodiments, the storage device determines (466) whether a memory operation in the first queue (e.g., operation queue 202-1, FIG. 2A or a first operation queue 236, FIG. 2B) subsequent to the first memory operation includes a respective indicator, and in accordance with a determination that the respective indicator of the subsequent memory operation is set, prevents suspension of the subsequent memory operation. For example, the respective indicator may be a "high priority" or "do not suspend" indicator.

In some embodiments, the non-volatile memory system (e.g., non-volatile memory system 100, FIG. 1) includes (416) a global indicator that when set indicates that memory operations in the first queue (e.g., operation queue 202-1, FIG. 2A or a first operation queue 236, FIG. 2B) cannot be suspended. For example, in some embodiments, when the global indicator is set, read, write and/or erase operations in the first queue cannot be suspended. In some embodiments, the global indicator is an input into a logic module (e.g., logic module 201, FIG. 2A or logic module 220, FIG. 2B).

In some embodiments, the storage device sets (418) the global indicator in accordance with a predefined condition or command. For example, in some embodiments, the global indicator is set when the non-volatile memory system (e.g., non-volatile memory system 100, FIG. 1) has experienced a power failure condition. In another example, the aforementioned command is a host command. In some embodiments, a logic module (e.g., logic module 201, FIG. 2A or logic module 220, FIG. 2B) is used to set the global indicator in accordance with the predefined condition or command.

In addition, in some embodiments, the storage device, in accordance with a determination that the global indicator is set, prevents (420) suspension of memory operations in the first queue (e.g., operation queue 202-1, FIG. 2A or a first operation queue 236, FIG. 2B). In some embodiments, a logic module (e.g., logic module 201, FIG. 2A) is used to prevent suspension of memory operations in the first queue. In some embodiments, an override module (e.g., override module 228, FIG. 2B) is used to prevent suspension of memory operations in the first queue.

In some embodiments, the non-volatile memory system (e.g., non-volatile memory system 100, FIG. 1) includes (422) one or more flash memory devices (e.g., NVM devices 140-$i$ through 140-$j$ and NVM devices 140-$m$ through 140-$n$, FIG. 1). In some embodiments, the non-volatile memory system includes a single flash memory device, while in other embodiments the non-volatile memory system includes a plurality of flash memory devices. For example, in some embodiments, the non-volatile memory system includes dozens or hundreds of flash memory devices, organized in parallel memory channels, such as 16, 32 or 64 flash memory devices per memory channel, and 8, 16 or 32 parallel memory channels. In some embodiments, the non-volatile memory system includes NAND-type flash memory or NOR-type flash memory. In other embodiments, the non-volatile memory system includes one or more other types of non-volatile storage devices.

In some embodiments, the non-volatile memory system (e.g., non-volatile memory system 100, FIG. 1) includes (424) one or more three-dimensional (3D) memory devices, as further defined herein, and circuitry associated with operation of memory elements in the one or more 3D memory devices. In some embodiments, the non-volatile memory system (e.g., non-volatile memory system 100, FIG. 1) includes a single 3D memory device, while in other embodiments the storage medium includes a plurality of 3D memory devices.

In some embodiments, the circuitry and one or more memory elements in a respective 3D memory device, of the one or more 3D memory devices, are (426) on the same substrate (e.g., a silicon substrate). In some embodiments, the substrate is a wafer on which the material layers of the one or more memory elements are deposited and/or in which the one or more memory elements are formed. In some embodiments, the substrate is a carrier substrate which is attached to the one or more memory elements after they are formed. As a non-limiting example, in some embodiments, the substrate includes a semiconductor such as silicon.

In some embodiments, the non-volatile memory system includes (428) a plurality of portions, each portion having one or more non-volatile memory devices (e.g., NVM devices 140-$i$ through 140-$j$ and NVM devices 140-$m$ through 140-$n$, FIG. 1), a respective first queue (e.g., operation queue 202-1, FIG. 2A or a first operation queue 236, FIG. 2B), a respective second queue (e.g., operation queue 202-2, FIG. 2A or a second operation queue 236, FIG. 2B), and a portion-specific indicator that when set indicates that memory operations in the respective first queue cannot be suspended. For example, in some embodiments each of the portions is a memory channel having multiple NVM devices, or a subset of a memory channel, or a single NVM device. In some embodiments, the portion-specific indicator is an input to a logic module (e.g., logic module 201, FIG. 2A or logic module 220, FIG. 2B).

In some embodiments, the storage device, in accordance with a determination that the portion-specific indicator for a respective portion of the non-volatile memory system (e.g., non-volatile memory system 100, FIG. 1) is set, prevents (430) suspension of memory operations in the first queue (e.g., operation queue 202-1, FIG. 2A or a first operation queue 236, FIG. 2B) of the respective portion of the non-volatile memory system.

In some embodiments, the non-volatile memory system (e.g., non-volatile memory system 100, FIG. 1) includes (432) a global indicator that when set indicates that memory operations in the respective first queues of the plurality of portions of the non-volatile memory system cannot be suspended. In these embodiments, the storage device sets (434) the global indicator in accordance with a predefined condition or command, and, in accordance with a determination that the global indicator is set, prevents (436) suspension of memory operations in the respective first queues of the plurality of portions of the non-volatile memory system.

In some embodiments, any of the methods described above are performed by a storage device, the storage device including (1) one or more processors, and (2) memory storing one or more programs, which when executed by the one or more processors cause the storage device to perform or control performance of any of the methods described herein.

In some embodiments, any of the methods described above are performed by a non-volatile memory system, the non-volatile memory system including (1) one or more processors, and (2) memory storing one or more programs, which when executed by the one or more processors cause the non-volatile memory system to perform or control performance of any of the methods described herein.

In some embodiments, any of the methods described above are performed by a non-volatile memory system including a plurality of portions, each portion having one or more non-volatile memory devices, wherein for each portion, the non-volatile memory system includes (1) one or more timers, (2) a first queue and a second queue, and (3) a logic module, wherein the logic module is configured to perform or control performance of any of the methods described herein.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible (e.g., a NOR memory array). NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The term "three-dimensional memory device" (or 3D memory device) is herein defined to mean a memory device having multiple memory layers or multiple levels (e.g., sometimes called multiple memory device levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

One of skill in the art will recognize that this invention is not limited to the two dimensional and three dimensional exemplary structures described but cover all relevant memory structures within the spirit and scope of the invention as described herein and as understood by one of skill in the art.

It will be understood that, although the terms "first," "second," etc. may be used herein to describe various elements, these elements should not be limited by these terms. These terms are only used to distinguish one element from another. For example, a first region could be termed a second region, and, similarly, a second region could be termed a first region, without changing the meaning of the description, so long as all occurrences of the "first region" are renamed consistently and all occurrences of the "second region" are renamed consistently. The first region and the second region are both regions, but they are not the same region.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the phrase "at least one of A, B and C" is to be construed to require one or more of the listed items, and this phase reads on a single instance of A alone, a single instance of B alone, or a single instance of C alone, while also encompassing combinations of the listed items such "one or more of A and one or more of B without any of C," and the like.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of operation in a non-volatile memory system, comprising:
   starting, in the non-volatile memory system, execution of a first memory operation from a first queue;
   in conjunction with starting execution of the first memory operation, starting a first timer in the non-volatile memory system, wherein the first timer is set to expire after a first predetermined time interval; and
   after starting the first timer, in accordance with a determination that the first timer has expired, performing one or more operations in the non-volatile memory system including:
      determining whether a second queue contains at least one memory operation for execution;
      in accordance with a determination that the second queue contains at least one memory operation for execution, performing one or more operations including:
         suspending the first memory operation from the first queue;

executing a second memory operation from the second queue; and after completing execution of the second memory operation from the second queue, performing one or more subsequent operations; and in accordance with a determination that the second queue does not contain at least one memory operation for execution, performing one or more operations including:

restarting the first timer, wherein restarting the first timer sets the first timer to expire after an interval equal to the first predetermined time interval; and continuing execution of the first memory operation from the first queue.

2. The method of claim 1, wherein the one or more subsequent operations include:

restarting the first timer, wherein restarting the first timer sets the first timer to expire after an interval equal to the first predetermined time interval; and resuming execution of the first memory operation from the first queue.

3. The method of claim 1, wherein read operations from a host system are placed in the second queue.

4. The method of claim 1, wherein:

the first queue and the second queue are logical queues; and both the first queue and the second queue are part of a single physical queue.

5. The method of claim 1, wherein the first queue and the second queue are distinct physical queues.

6. The method of claim 1, wherein the non-volatile memory system includes a global indicator that, when set, indicates that memory operations in the first queue cannot be suspended, and the method further comprises:

setting the global indicator in accordance with a predefined condition or command;

in accordance with a determination that the global indicator is set, preventing suspension of memory operations in the first queue.

7. The method of claim 1, further comprising, in accordance with each of one or more subsequent determinations that the first timer has expired, performing one or more operations including:

determining whether the second queue contains at least one memory operation for execution;

in accordance with a determination that the second queue contains at least one memory operation for execution, performing one or more operations including:

suspending the first memory operation from the first queue;

executing a memory operation from the second queue; and after completing execution of the memory operation from the second queue, performing one or more subsequent operations including:

restarting the first timer, wherein restarting the first timer sets the first timer to expire after an interval equal to the first predetermined time interval; and resuming execution of the first memory operation from the first queue; and in accordance with a determination that the second queue does not contain at least one memory operation for execution, performing one or more operations including:

restarting the first timer, wherein restarting the first timer sets the first timer to expire after an interval equal to the first predetermined time interval; and continuing execution of the first memory operation from the first queue.

8. The method of claim 1, further comprising:

starting, in the non-volatile memory system, execution of a third memory operation from the first queue;

in conjunction with starting execution of the third memory operation, starting a second timer in the non-volatile memory system, wherein the second timer is set to expire after a second predetermined time interval; and after starting the second timer, in accordance with a determination that the second timer has expired, performing one or more operations in the non-volatile memory system including:

determining whether the second queue contains at least one memory operation for execution;

in accordance with a determination that the second queue contains at least one memory operation for execution, performing one or more operations including:

suspending the third memory operation from the first queue;

executing a fourth memory operation from the second queue; and after completing execution of the fourth memory operation from the second queue, performing one or more subsequent operations including:

restarting the second timer; and resuming execution of the third memory operation from the first queue; and in accordance with a determination that the second queue does not contain at least one memory operation for execution, performing one or more operations including:

restarting the second timer; and continuing execution of the third memory operation from the first queue.

9. The method of claim 8, wherein the second predetermined time interval is distinct from the first predetermined time interval.

10. The method of claim 1, further comprising, in accordance with a determination that an indicator of a subsequent memory operation is set, preventing suspension of the subsequent memory operation.

11. The method of claim 1, wherein the non-volatile memory system includes a plurality of portions, a first queue, a second queue, and a portion-specific indicator that when set indicates that memory operations in the first queue cannot be suspended, wherein each portion includes one or more non-volatile memory devices; and the method further comprises, in accordance with a determination that the portion-specific indicator for a first portion of the non-volatile memory system is set, preventing suspension of memory operations in the first queue of the first portion of the non-volatile memory system.

12. A non-volatile memory system including a plurality of portions, each portion having one or more non-volatile memory devices, wherein for each portion, the non-volatile memory system comprises:

one or more timers;

a first queue and a second queue; and a logic module, wherein the logic module is configured to:

start, in the non-volatile memory system, execution of a first memory operation from the first queue;

in conjunction with starting execution of the first memory operation, start a first timer of the one or more timers in the non-volatile memory system, wherein the first timer is set to expire after a first predetermined time interval; and after starting the first timer, in accordance with a determination that the first timer has expired, perform one or more operations in the non-volatile memory system including:
   determining whether the second queue contains at least one memory operation for execution;
   in accordance with a determination that the second queue contains at least one memory operation for execution, performing one or more operations including:
      suspending the first memory operation from the first queue;
      executing a second memory operation from the second queue; and
      after completing execution of the second memory operation from the second queue, performing one or more subsequent operations; and
   in accordance with a determination that the second queue does not contain at least one memory operation for execution, performing one or more operations including:
      restarting the first timer, wherein restarting the first timer sets the first timer to expire after an interval equal to the first predetermined time interval; and
      continuing execution of the first memory operation from the first queue.

13. The non-volatile memory system of claim 12, wherein the one or more subsequent operations include:
   restarting the first timer, wherein restarting the first timer sets the first timer to expire after an interval equal to the first predetermined time interval; and
   resuming execution of the first memory operation from the first queue.

14. The non-volatile memory system of claim 12, wherein the non-volatile memory system includes a global indicator that, when set, indicates that memory operations in the first queue cannot be suspended, and the logic module is further configured to:
   set the global indicator in accordance with a predefined condition or command;
   in accordance with a determination that the global indicator is set, prevent suspension of memory operations in the first queue.

15. The non-volatile memory system of claim 12, the logic module further configured to, in accordance with each of one or more subsequent determinations that the first timer has expired, perform one or more operations including:
   determining whether the second queue contains at least one memory operation for execution;
   in accordance with a determination that the second queue contains at least one memory operation for execution, performing one or more operations including:
      suspending the first memory operation from the first queue;
      executing a memory operation from the second queue; and
      after completing execution of the memory operation from the second queue, performing one or more subsequent operations including:
         restarting the first timer, wherein restarting the first timer sets the first timer to expire after an interval equal to the first predetermined time interval; and
         resuming execution of the first memory operation from the first queue; and
   in accordance with a determination that the second queue does not contain at least one memory operation for execution, performing one or more operations including:
      restarting the first timer, wherein restarting the first timer sets the first timer to expire after an interval equal to the first predetermined time interval; and
      continuing execution of the first memory operation from the first queue.

16. The non-volatile memory system of claim 12, the logic module further configured to:
   start, in the non-volatile memory system, execution of a third memory operation from the first queue;
   in conjunction with starting execution of the third memory operation, start a second timer in the non-volatile memory system, wherein the second timer is set to expire after a second predetermined time interval; and
   after starting the second timer, in accordance with a determination that the second timer has expired, perform one or more operations in the non-volatile memory system including:
      determining whether the second queue contains at least one memory operation for execution;
      in accordance with a determination that the second queue contains at least one memory operation for execution, performing one or more operations including:
         suspending the third memory operation from the first queue;
         executing a fourth memory operation from the second queue; and
         after completing execution of the fourth memory operation from the second queue, performing one or more subsequent operations including:
            restarting the second timer; and
            resuming execution of the third memory operation from the first queue; and
      in accordance with a determination that the second queue does not contain at least one memory operation for execution, performing one or more operations including:
         restarting the second timer; and
         continuing execution of the third memory operation from the first queue.

17. The non-volatile memory system of claim 12, the logic module further configured to, in accordance with a determination that an indicator of a subsequent memory operation is set, prevent suspension of the subsequent memory operation.

18. The non-volatile memory system of claim 12, wherein the non-volatile memory system includes a plurality of portions, a first queue, a second queue, and a portion-specific indicator that when set indicates that memory operations in the first queue cannot be suspended, wherein each portion includes one or more non-volatile memory devices; and
   the logic module is further configured to, in accordance with a determination that the portion-specific indicator for a first portion of the non-volatile memory system is set, prevent suspension of memory operations in the first queue of the first portion of the non-volatile memory system.

19. A non-transitory computer-readable storage medium storing one or more programs configured for execution by one or more processors of a non-volatile memory system, the one or more programs including instructions for:
    starting, in the non-volatile memory system, execution of a first memory operation from a first queue;
    in conjunction with starting execution of the first memory operation, starting a first timer in the non-volatile memory system, wherein the first timer is set to expire after a first predetermined time interval; and
    after starting the first timer, in accordance with a determination that the first timer has expired, performing one or more operations in the non-volatile memory system including:
        determining whether a second queue contains at least one memory operation for execution;
        in accordance with a determination that the second queue contains at least one memory operation for execution, performing one or more operations including:
            suspending the first memory operation from the first queue;
            executing a second memory operation from the second queue; and
            after completing execution of the second memory operation from the second queue, performing one or more subsequent operations; and
        in accordance with a determination that the second queue does not contain at least one memory operation for execution, performing one or more operations including:
            restarting the first timer, wherein restarting the first timer sets the first timer to expire after an interval equal to the first predetermined time interval and continuing execution of the first memory operation from the first queue.

20. The non-transitory computer-readable storage medium of claim 19, wherein the one or more subsequent operations include:
    restarting the first timer, wherein restarting the first timer sets the first timer to expire after an interval equal to the first predetermined time interval; and
    resuming execution of the first memory operation from the first queue.

21. The non-transitory computer-readable storage medium of claim 19, wherein the non-volatile memory system includes a global indicator that, when set, indicates that memory operations in the first queue cannot be suspended, and the one or more programs further include instructions for:
    setting the global indicator in accordance with a predefined condition or command;
    in accordance with a determination that the global indicator is set, preventing suspension of memory operations in the first queue.

22. The non-transitory computer-readable storage medium of claim 19, the one or more programs further including instructions for, in accordance with each of one or more subsequent determinations that the first timer has expired, performing one or more operations including:
    determining whether the second queue contains at least one memory operation for execution;
    in accordance with a determination that the second queue contains at least one memory operation for execution, performing one or more operations including:
        suspending the first memory operation from the first queue;
        executing a memory operation from the second queue; and
        after completing execution of the memory operation from the second queue, performing one or more subsequent operations including:
            restarting the first timer, wherein restarting the first timer sets the first timer to expire after an interval equal to the first predetermined time interval; and
            resuming execution of the first memory operation from the first queue; and
    in accordance with a determination that the second queue does not contain at least one memory operation for execution, performing one or more operations including:
        restarting the first timer, wherein restarting the first timer sets the first timer to expire after an interval equal to the first predetermined time interval; and
        continuing execution of the first memory operation from the first queue.

23. The non-transitory computer-readable storage medium of claim 19, the one or more programs further including instructions for:
    starting, in the non-volatile memory system, execution of a third memory operation from the first queue;
    in conjunction with starting execution of the third memory operation, starting a second timer in the non-volatile memory system, wherein the second timer is set to expire after a second predetermined time interval; and
    after starting the second timer, in accordance with a determination that the second timer has expired, performing one or more operations in the non-volatile memory system including:
        determining whether the second queue contains at least one memory operation for execution;
        in accordance with a determination that the second queue contains at least one memory operation for execution, performing one or more operations including:
            suspending the third memory operation from the first queue;
            executing a fourth memory operation from the second queue; and
            after completing execution of the fourth memory operation from the second queue, performing one or more subsequent operations including:
                restarting the second timer; and
                resuming execution of the third memory operation from the first queue; and
        in accordance with a determination that the second queue does not contain at least one memory operation for execution, performing one or more operations including:
            restarting the second timer; and
            continuing execution of the third memory operation from the first queue.

24. The non-transitory computer-readable storage medium of claim 19, the one or more programs further including instructions for, in accordance with a determination that an indicator of a subsequent memory operation is set, preventing suspension of the subsequent memory operation.

25. The non-transitory computer-readable storage medium of claim 19, wherein the non-volatile memory system includes a plurality of portions, a first queue, a second queue, and a portion-specific indicator that when set indicates that memory operations in the first queue cannot be suspended, wherein each portion includes one or more non-volatile memory devices; and the one or more programs further include instructions for, in accordance with a determination that the portion-specific indicator for a first portion of the non-volatile memory system is set, preventing suspension of memory operations in the first queue of the first portion of the non-volatile memory system.

\* \* \* \* \*